(12) United States Patent
Yamamoto et al.

(10) Patent No.: US 7,615,203 B2
(45) Date of Patent: *Nov. 10, 2009

(54) SINGLE CRYSTAL DIAMOND

(75) Inventors: Yoshiyuki Yamamoto, Itami (JP); Kiichi Meguro, Itami (JP); Takahiro Imai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 427 days.

This patent is subject to a terminal disclaimer.

(21) Appl. No.: 10/584,927

(22) PCT Filed: May 26, 2005

(86) PCT No.: PCT/JP2005/009688

§ 371 (c)(1),
(2), (4) Date: Jul. 5, 2006

(87) PCT Pub. No.: WO2006/048957

PCT Pub. Date: May 11, 2006

(65) Prior Publication Data

US 2008/0311023 A1 Dec. 18, 2008

(30) Foreign Application Priority Data

Nov. 5, 2004 (JP) ............................. 2004-322048
Apr. 15, 2005 (JP) ............................. 2005-117948

(51) Int. Cl.
C30B 23/00 (2006.01)
C30B 17/00 (2006.01)
B01J 3/06 (2006.01)
B32B 9/00 (2006.01)
D06N 7/04 (2006.01)
H05H 1/24 (2006.01)
H01L 31/0312 (2006.01)

(52) U.S. Cl. .......................... 423/446; 117/84; 117/88; 117/97; 117/105; 117/101; 117/77; 117/94; 257/77; 428/141; 427/577

(58) Field of Classification Search .................. None
See application file for complete search history.

(56) References Cited

U.S. PATENT DOCUMENTS

2003/0131787 A1* 7/2003 Linares et al. ................ 117/93

2004/0175499 A1* 9/2004 Twitchen et al. ......... 427/249.8
2006/0231015 A1* 10/2006 Meguro et al. ................ 117/84

FOREIGN PATENT DOCUMENTS

| JP | 63-224225 | 9/1988 |
| JP | 2-233591 | 9/1990 |
| JP | 01071771 | * 11/1990 |
| JP | 3-75298 | 3/1991 |
| JP | 04-092896 | 3/1992 |
| JP | 4-132678 | 5/1992 |
| JP | 07-017794 | 1/1995 |
| JP | 09-165295 | 6/1997 |
| JP | 2002-299741 | 10/2002 |
| JP | 2003-277183 | 10/2003 |
| JP | 2003277183 A | * 10/2003 |
| WO | WO 01/96633 A1 | 12/2001 |

OTHER PUBLICATIONS

May; CVD Diamond- A New technology for the Future?; School of Chemistry, Iniverity of Bristol, Bristol BS8 1TS, U.K.*
Landstrass et al. Device Properties of Homoepitaxially Grown Diamond; Diamond and Related Materials; 2, pp. 1033-1037; 1993.*
International Preliminary Report on Patentability and Written Opinion of The International Searching Authority issued in International Application No. PCT/JP2005/009688, dated May 18, 2007.
Japanese Office Action issued in Japanese Patent Application No. JP 2003-402410 dated on Jan. 29, 2009.

* cited by examiner

*Primary Examiner*—Melvin C Mayes
*Assistant Examiner*—Guinever S Gregorio
(74) *Attorney, Agent, or Firm*—McDermott Will & Emery LLP

(57) ABSTRACT

A single crystal diamond grown by vapor phase synthesis, wherein when one main surface is irradiated with a linearly polarized light considered to be the synthesis of two mutually perpendicular linearly polarized light beams, the phase difference between the two mutually perpendicular linearly polarized light beams exiting another main surface on the opposite side is, at a maximum, not more than 50 nm per 100 μm of crystal thickness over the entire crystal. This single crystal diamond is of a large size and high quality unattainable up to now, and has characteristics that are extremely desirable in semiconductor device substrates and are applied to optical components of which low strain is required.

17 Claims, No Drawings

SINGLE CRYSTAL DIAMOND

RELATED APPLICATION

This application is a national phase of PCT/JP2005/009688 filed on May 26, 2005, which claims priority from Japanese Application No. 2004-322048 filed Nov. 5, 2004 and Japanese Application No. 2005-117948 filed Apr. 15, 2005, the disclosures of which Applications are incorporated by reference herein. The benefit of the filing and priority dates of the International and Japanese Applications is respectfully requested.

TECHNICAL FIELD

The present invention relates to diamond, and more particularly a high-quality, large-size single crystal diamond that is suited to use in semiconductor device substrates and optical components, and a method for manufacturing this diamond.

BACKGROUND ART

Besides its high hardness and thermal conductivity, diamond also has many other excellent properties, such as a high optical transmittance and a wide bandgap, and is therefore widely used as a material for various tools, optical components, semiconductors, and electronic components, and its importance is only expected to grow in the future. In the past, naturally produced diamond has been used in industrial applications, but since natural diamond has a quite-variable quality, more and more manmade diamond is being used an industrial setting. Diamond single crystals today are synthesized industrially under high temperature and pressure (several thousand degrees centigrade, and several tens of thousands of atmospheres). Super-high-pressure vessels that can withstand such high temperatures and pressures are extremely expensive, and there is a limit to their size, which imposes a limit to how large a single crystal can be synthesized by high-temperature, high-pressure methods. Ib-type diamond which contains nitrogen (N) as an impurity and is yellow in color has been synthesized by high-temperature, high-pressure methods and marketed in a diameter of about 1 cm, but this approximate size is thought to be the limit. IIa-type diamond which contains few impurities and is colorless and transparent can be mass-produced industrially in a size of only about a few millimeters.

Meanwhile, another method that has been established as a diamond synthesis method alongside the high-temperature, high-pressure method is vapor phase synthesis. With this method, diamond with a relatively large surface area of from a few centimeters up to 10 cm, or even larger, can be manufactured artificially, but the product is usually a polycrystalline film. However, of the many applications of diamond, when the product is used for semiconductor substrates, optical components, or ultra-precision tools that require particularly smooth surfaces, it is necessary to use single-crystal diamond. In view of this, methods for obtaining single crystal diamond by epitaxial growth by vapor phase synthesis have been studied in the past.

Epitaxial growth is generally broken down into homoepitaxial growth in which the substance to be grown is grown on a substrate of the same type, and heteroepitaxial growth in which the substance is growth on a different type of substrate. With heteroepitaxial growth, there have been reports dealing with cubic boron nitride (cBN), silicon carbide (SiC), silicon (Si), nickel, cobalt, and so forth (see Patent Documents 1 to 3 listed below), but since single crystals with good film quality cannot be obtained by heteroepitaxial growth, synthesis of single crystals by homoepitaxial growth is considered more effective. With homoepitaxial growth, it is possible to obtain large IIa diamond single crystals that are greater than IIa diamond obtained by a high-temperature, high-pressure method, by epitaxially growing high-purity diamond from the vapor phase on an Ib diamond substrate produced by high-temperature, high-pressure synthesis. It has also been reported that diamond having just small angle boundaries can be obtained by using a plurality of diamond substrates all oriented in the same crystal orientation, or using diamond particles and growing integrated diamond over these (see Patent Document 4).

Patent Document 1: Japanese Patent Publication 63-224225A
Patent Document 2: Japanese Patent Publication 2-233591A
Patent Document 3: Japanese Patent Publication 4-132687A
Patent Document 4: Japanese Patent Publication 3-75298A

DISCLOSURE OF THE INVENTION

Problems that the Invention is to Solve

When single crystal diamond obtained by these methods is utilized as a semiconductor device substrate, it needs to have a large surface area, low strain, and low cost. Furthermore, when single crystal diamond is used as an optical window or other such optical component, and particularly as an optical component that will be used in the short wavelength range, the diamond must have low absorption at short wavelengths (up to 225 nm, which is the absorption edge of diamond).

Means for Solving the Problems

In view of this, the inventors conducted diligent research, and as a result perfected the present invention upon discovering that if in an evaluation method utilizing birefringent light the phase difference produced when mutually perpendicular linearly polarized light beams pass through a sample falls within a certain range, this phase difference will have no major effect on the characteristics of the sample as a semiconductor substrate.

Specifically, the gist of the present invention is as follows.

(1) A single crystal diamond grown by vapor phase synthesis, wherein when one main surface is irradiated with a linearly polarized light considered to be the synthesis of two mutually perpendicular linearly polarized light beams, the phase difference between the two mutually perpendicular linearly polarized light beams exiting another main surface on the opposite side is, at a maximum, not more than 50 nm per 100 μm of crystal thickness over the entire crystal.

(2) The single crystal diamond according to (1) above, wherein the single crystal diamond has a thickness of at least 100 μm and not more than 1500 μm.

(3) The single crystal diamond according to (1) or (2) above, wherein the single crystal diamond has a resistivity of at least $10^{12}$ Ω·cm at room temperature.

(4) The single crystal diamond according to any of (1) to (3) above, wherein the spin density obtained by electron spin resonance is not more than $1 \times 10^{17}/cm^3$ at room temperature within a g value range of at least 2.0.02 and less than 2.0028.

(5) The single crystal diamond according to any of (1) to (4) above, wherein the concentration of nitrogen atoms contained as an impurity is from 0.01 to 100 ppm.

(6) The single crystal diamond according to any of (1) to (5) above, wherein the concentration of silicon atoms contained as an impurity is from 0.01 to 1000 ppm.

(7) The single crystal diamond according to any of (1) to (6) above, wherein the single crystal diamond has a half-width between 10 and 80 seconds in an X-ray rocking curve in a (400) plane over an entire crystal, and has, as impurities, a concentration of hydrogen atoms between 10 and 100 ppm and a concentration of nitrogen atoms between 0.01 and 100 ppm.

(8) The single crystal diamond according to (7) above, wherein the concentration of hydrogen atoms as an impurity is from 20 to 70 ppm.

(9) The single crystal diamond according to any of (1) to (8) above, wherein the single crystal diamond has a thermal conductivity of at least 2000 W/m·K at room temperature.

(10) The single crystal diamond according to any of (1) to (9) above, wherein the single crystal diamond has a hole mobility of at least 1500 $cm^2$/V sec at room temperature.

(11) The single crystal diamond according to any of (1) to (10) above, wherein the single crystal diamond has an electron mobility of at least 1500 $cm^2$/V·sec at room temperature.

(12) The single crystal diamond according to any of (1) to (11) above, wherein a peak appearing at a Raman shift of 1332 $cm^{-1}$ in Raman spectroscopy has a half-width of not more than 2 $cm^{-1}$.

(13) The single crystal diamond according to any of (1) to (12) above, wherein surface etch pits appearing as a result of hydrogen plasma treatment are present in a quantity of not more than $1 \times 10^5$ per square centimeter.

(14) The single crystal diamond according to any of (1) to (13) above, wherein the number of crystal defects as evaluated by light scattering tomography is not more than $1 \times 10^5$ per square centimeter.

(15) The single crystal diamond according to any of (1) to (14) above, wherein the single crystal diamond has a Young's modulus of at least $5 \times 10^{11}$ Pa.

(16) The single crystal diamond according to any of (1) to (15) above, wherein the single crystal diamond has a diameter of at least 4 mm.

(17) The single crystal diamond according to any of (1) to (16) above, wherein the single crystal diamond has a diameter of at least 10 mm.

(18) The single crystal diamond according to any of (1) to (17) above, wherein the concentration of nitrogen atoms as an impurity is from 0.01 to 5 ppm.

(19) The single crystal diamond according to any of (1) to (18) above, wherein the single crystal diamond has a transmittance of at least 30% at a wavelength of 250 nm.

(20) A semiconductor substrate comprising the single crystal diamond according to any of (1) to (19) above.

(21) An optical window comprising the single crystal diamond according to any of (1) to (19) above.

In this application, unless otherwise specified, the concentration of nitrogen atoms, silicon atoms, and hydrogen atoms is given as the number of atoms per carbon atom.

It was found that a diamond substrate such as this is obtained by a manufacturing method comprising a step of readying a single crystal diamond substrate produced by vapor phase synthesis as a seed substrate, and a step of etching away one main surface thereof by reactive ion etching (hereinafter referred to as RIE) and then growing a new single crystal diamond layer on the main surface by vapor phase synthesis, and preferably also comprising a step of separating the single crystal diamond substrate used as the seed substrate from the single crystal diamond layer newly grown by vapor phase synthesis. It was also found that this diamond substrate can be obtained by a manufacturing method including a step of etching away at least 50 nm of the side surfaces of the seed substrate prior to the step of etching away the main surface by reactive ion etching.

The inventors conducted diligent research into the characteristics of single crystal diamond when used as a semiconductor device substrate and the characteristics when used as an optical component, in which they focused on crystal strain. As a result, they discovered that having the phase difference produced when mutually perpendicular linearly polarized light beams pass through a sample (single crystal diamond) fall within a certain range in an evaluation method utilizing birefringent light is important in terms of maintaining good characteristics as a semiconductor device substrate and good characteristics as an optical component. Specifically, this range is such that the maximum phase difference per 100 μm of thickness is from 10 to 50 nm over the entire sample.

This phase difference is zero in a completely optically symmetric crystal with no strain whatsoever. Actual crystals, however, usually have some strain, sometimes more and sometimes less. The strain in a crystal can be quantified by evaluating this phase difference in a transparent crystal. It was found that this phase difference can vary even though the rocking curve half-width in a (400) plane falls within a range of 10 to 80 seconds. To find the cause of this, the inventors first turned their attention to impurities contained in the crystal. Specifically, it was found that the above-mentioned phase difference can be achieved when the nitrogen and silicon concentrations are within the ranges of 0.01 to 100 ppm and 0.01 to 1000 ppm, respectively. It was also discovered that optical strain can be reduced over the entire crystal if the spin density obtained by electron spin resonance is not more than $1 \times 10^{17}$/$cm^3$ at room temperature within a g value range of at least 2.002 and less than 2.0028; if a seed substrate grown by vapor phase synthesis, rather than a natural single crystal substrate or one produced by high-temperature, high-pressure synthesis, is used as the seed substrate; if one main surface of the crystal is etched away by reactive ion etching and then a new single crystal diamond layer is grown on that main surface by vapor phase synthesis; and if a step is included in which at least 50 nm of the side surfaces is etched away prior to the step of etching away the main surface by reactive ion etching.

When the present invention is used as a material for a semiconductor device substrate or an optical component, its thickness is preferably from 100 to 1500 μm. The greater the diameter, the better, but 4 mm or larger is sufficient size for device development.

As to the method for manufacturing this substrate, vapor phase synthesis is of course preferable for producing the seed substrate, and it is also preferable to include a step of separating the newly grown single crystal layer from the seed substrate by slicing with a laser beam having a wavelength of 360 nm or less. This contributes greatly to reducing cost because it minimizes machining loss as compared to a method in which the diamond is separated by slicing with a laser whose wavelength is over 360 nm, not to mention a method in which the seed substrate is cut off by grinding or the like.

It was found that strain can be reduced by using a seed substrate produced by vapor phase synthesis as compared to one produced by a high-temperature, high-pressure method. The reason for this is that with a diamond single crystal obtained by growing a diamond layer by vapor phase synthesis over a diamond seed substrate obtained by high-temperature, high-pressure synthesis, the differences between the two synthesis methods result in differences in the distribution and amounts of impurities, and the defect introduction mechanism, so even though they are both single crystals, they have slightly different properties, such as their coefficients of thermal expansion, and as a result strain accumulates. It was found that when a diamond substrate produced by vapor phase synthesis is used as a seed substrate, and a diamond layer is grown over this seed substrate by vapor phase synthesis, even if the above-mentioned strain remains in this seed substrate, the strain will not readily be introduced into the single crystal substrate that is newly grown.

Furthermore, it was found that removing one main surface of the single crystal diamond substrate that serves as the seed by reactive ion etching, and then growing a new single crystal diamond layer by vapor phase synthesis is very effective at reducing strain.

Specifically, it is preferable to grow a single crystal after etching away at least 0.5 μm and less than 400 μm of a main surface of a mechanically polished seed substrate by RIE prior to the growth of the single crystal. A seed substrate with no work-affected layer may be readied to suppress the occurrence of strain during the vapor phase growth of the single crystal diamond, but a work-affected layer, because of how it is produced, is difficult to remove from the surface of a seed substrate by mechanical polishing. There is a variety of known processes for the non-mechanical working of diamond in addition to the above-mentioned RIE, such as microwave plasma etching, ECR plasma etching, and ion beam etching. With these non-mechanical working processes other than RIE, it is difficult to solve all problems at the same time, such as the formation of a damage layer during etching, surface roughness after working, or problems in the working rate and working surface area of the seed substrate. With RIE, just the work-affected layer of the seed substrate can be removed, without damage, quickly, and with good flatness. After this, the vapor phase growth of a single crystal will yield a large diamond single crystal substrate with no strain and with high quality.

The RIE of the present invention can be carried out by a known method. Such methods can be broadly classified into methods that involve the use of a capacitively coupled plasma (CCP) in which a high-frequency power source is connected to electrodes disposed across from each other in a vacuum vessel, and methods that involve the use of an inductively coupled plasma (ICP) in which a high-frequency power source is connected to a coil disposed so as to surround a vacuum vessel. There are also methods that are a combination of the above two, and any of these methods can be used in the present invention.

A mixed gas of oxygen and a fluorocarbon is preferably used as the etching gas, and the etching pressure is preferably at least 1.33 Pa and no more than 13.3 Pa. Using the above type of gas and gas pressure allows just the work-affected layer to be removed quickly and with good flatness.

The etching thickness of the seed substrate in the present invention may be at least 0.5 μm and less than 400 μm, and is preferably at least 5 μm and less than 50 μm, and even more preferably at least 10 μm and less than 30 μm. The less the etching thickness, the shorter the working time, and the better the flatness of the surface is maintained. The thickness of the work-affected layer of the seed substrate depends on the type and conditions of polishing used. For most of the layer the thickness is less than 0.5 μm, but there are rare instances when a depth of about 10 μm may be reached in places, and the characteristics as a semiconductor may suffer in the regions grown from these portions. Conversely, if the etching depth is greater, not only will etching take longer, but the surface roughness caused by etching may expand. A decrease in crystallinity due to surface roughness is sometimes seen in subsequent single crystal growth.

The side surfaces of the seed substrate in the present invention are preferably etched away, by the same RIE, in an amount of at least 50 nm, and preferably at least 0.15 μm. In particular, when the side surfaces are mechanically polished in the same way as the main surface, the etching is preferably to at least 0.5 μm. This allows strain to be reduced in the regions grown laterally from the side surfaces, particularly when expansion growth in the lateral direction has occurred during the thick-film growth of the single crystal. One method for the RIE of the side surfaces is to etch simultaneously from the side surfaces in the course of the RIE of the seed substrate main surface, but standing the substrate on end and etching just the side surfaces is a more efficient method because the etching thickness can be controlled independently.

The etching of the side surfaces is preferably performed ahead of the etching of the main surface. Specifically, side surface etching requires that the substrate be stood on end and the main surface covered, but the main surface can be damaged during covering, etc. This damage can also be removed by the etching of the main surface performed in the present invention. The main surface of the seed substrate used here is preferably (100) or approximately (100).

The vapor phase synthesis method used in the present invention to grow the diamond single crystal may be hot filament CVD, plasma CVD, plasma jet, combustion flame, laser CVD, or another known method. The raw material gas may be a hydrocarbon or another substance containing carbon, examples of which include methane, ethane, propane, methanol, ethanol, ethylene, acetylene, and benzene.

EFFECTS OF THE INVENTION

Usually, with vapor phase synthesis, the inclusion of hydrogen into the resulting diamond is unavoidable because the process gas contains a large excess of hydrogen, and this inclusion has been considered to be one cause of diminished electrical and optical characteristics of the diamond that is obtained. However, even if hydrogen is present, when the growth method disclosed in the present invention is applied, diamond single crystals will be obtained that have characteristics which are favorable in optical applications and semiconductor device applications.

EXAMPLES

The present invention will now be described through Examples and Comparative Examples.

The results of evaluating the samples obtained in the Examples and Comparative Examples are given in Table 1, and the evaluation categories in this table are defined as follows.

"Phase Difference"

This was measured by the method of de Senarmont. Specifically, a quarter wave plate and a polarizer were combined and elliptically polarized light that had been transmitted through the sample was converted into linearly polarized light, and the phase difference was calculated. A sodium lamp (wavelength of 589 nm) was used for the measurement light source. The phase difference thus obtained was evaluated after being calculated per 100 μm of sample thickness. The measurement was conducted using a polarizing microscope, the entire sample was observed, and the maximum value was found. The positional resolution of the measurement was at least 100 μm.

"XRC"

XRC is a half-width (seconds) of an X-ray rocking curve in a (400) plane. As used in the present invention, XRC indicates the result evaluated by a double crystal method using CuKα1 X-rays, and utilizing, as the first crystal, the (400) planes of diamonds, produced by high-temperature, high-pressure synthesis, in the parallel disposition with respect to each other.

"Resistivity"

Electrode metal was formed on both sides of a sample, a specific electric field was applied, and the current flowing at this point was measured to find the resistivity. This measurement was conducted at room temperature.

"Spin Density"

This was found by ESR (Electron Spin Resonance). The measurements were all made at room temperature. The center magnetic field was 3370 G, the magnetic field sweep width was 100 G, the microwave frequency was 9.46 GHz, and the output was 0.01 to 0.16 mW. The measurements were all conducted with an external magnetic field oriented in the single crystal <100> axis direction. The spin density within a g value range of at least 2.002 and less than 2.0028 was calculated from the spectrum thus obtained.

"Nitrogen Impurity Concentration, Silicon Impurity"

This was evaluated by SIMS (Secondary Ion Mass Spectrometry). In SIMS analysis, $Cs^+$ was used as the primary ion, the acceleration voltage was 15 kV, the detection region had a diameter Ø of 35 μm, and the concentration was found at a place where sputtering was performed 0.5 μm from the outermost surface of the sample. The concentration was quantified by comparison with a separately prepared standard sample (single crystal diamond of known impurity concentration, produced by ion implantation).

"Hydrogen Impurity Concentration"

The concentration of hydrogen contained in the crystal was quantified by infrared transmission and absorption method.

"Diameter"

This is the maximum diameter of the sample.

"Transmittance"

The transmittance at a wavelength of 250 nm was measured.

"Thermal Conductivity"

The thermal conductivity at room temperature was measured by steady state comparison method.

"Electron Mobility" and "Hole Mobility"

These are the electron mobility and hole mobility at room temperature, and were evaluated by TOF (Time Of Flight) method.

"Raman"

This indicates the half-width of the Raman scattering spectrum appearing shifted to a position of 1332 $cm^{-1}$ from the excitation light when a sample was evaluated by microscope Raman spectroscopy, using an argon ion laser with a wavelength of 514.5 nm as the excitation light. The sample was evaluated with a polarizer having a resolution of 0.5 $cm^{-1}$.

"Hydrogen Plasma"

This is the number of etch pits produced when the obtained single crystal diamond was exposed to a hydrogen plasma produced by microwave plasma CVD, and etch pits attributable to defects were produced on the surface. The hydrogen plasma used here had a pressure of 10 kPa, and the substrate temperature was 800° C.

"Tomography"

The number of crystal defects inside a diamond single crystal was evaluated by light scattering tomography. The outer periphery of the sample was laser cut and mirror polished, and an argon ion laser beam was incident from a side surface. Light scattering from a main surface and attributable to defects was evaluated.

"Young's Modulus"

This is the Young's modulus at room temperature, and was evaluated by the testing method for three-point flexural strength.

Homoepitaxial growth was performed by vapor phase synthesis using as a seed substrate a single crystal Ib substrate synthesized by high-temperature, high-pressure method and measuring 3.5×4.5×0.5 mm. The main surface of the seed substrate was (100) (0.8° off in the <110> direction). The growth conditions comprised a methane concentration of 12% (diluted with hydrogen), a pressure of 110 Torr, and a substrate temperature of 950° C.

After growth, the crystal was shaped and cut off with a YAG fundamental wave laser (wavelength 1.064 μm, output 12 W). After this, the crystal was washed with dichroic acid to obtain Sample A measuring 3.9×4.8×0.2 mm. (The main surface was (100), 0.9° off in the <110> direction.)

Using this Sample A as a seed substrate, growth was continued under the same conditions as above to obtain a new diamond single crystal layer by vapor phase synthesis in a thickness of 900 μm. Prior to this growth, the main surface on which the new single crystal layer would be grown was etched away by RIE of a known high-frequency inter-electrode discharge type (CCP) of RIE. The etching conditions were as follows.

High frequency: 13.56 MHz
High-frequency power: 280 W
Chamber pressure: 7 Pa
$O_2$ gas flow: 8 sccm
$CF_4$ gas flow: 10 sccm
Etching time: 6 hours The main surface of the seed substrate (Sample A) was etched away to 16 μm, and the surface roughness after etching was 0.12 μm, which was substantially the same as that before etching.

The seed substrate (Sample A) was separated from this with a YAG triple harmonic laser (wavelength 355 nm, output 8 W). The single crystal layer newly grown by vapor phase synthesis was subjected to mirror polishing on both the surface on the growth side and the surface on the substrate side, which gave Sample B measuring 4.4×5.2×0.2 mm.

Next, Sample C was produced under the same conditions as sample B, using Sample A' produced under the same conditions as Sample A as the seed substrate. However, prior to this growth, the Sample A' was first stood on end and all the side surfaces of the sample were etched, and then the main surface on which the single crystal layer was to be newly grown was etched. The etching conditions were the same as those for Sample A. The four side surfaces were etched for 6 hours each, and the main surface was etched for 8 hours, the result being that the side surfaces were etched 12 to 17 μm, and the main surface 22 μm.

Next, using Sample A" produced under the same conditions as Samples A and A' as the seed substrate, growth was performed at a methane concentration of 8%, a pressure of 100 Torr, and a substrate temperature of 780° C. However, the RIE etching of the main surface was performed prior to the epitaxial growth, just as with Sample B.

The seed substrate (Sample A") was separated from this with a YAG third harmonic laser, and the surface on the growth side and the surface on the substrate side were both subjected to mirror polishing, which gave Sample D measuring 4.4×5.1×0.3 mm.

Sample E was produced as follows. Using a sample produced under the same conditions as Samples A, A', and A" as the seed substrate, growth was performed at a methane concentration of 7%, a pressure of 90 Torr, and a substrate temperature of 750° C. No RIE was performed prior to this growth.

Samples A to E were evaluated for the categories listed above, along with two IIa type natural diamond single crystals (Samples F and G), two Ia type crystals (Samples H and I), three Ib type single crystals made by high-temperature, high-pressure synthesis (Samples J, K, and L), and one IIa type single crystal made by high-temperature, high-pressure synthesis (Sample M), the results of which are given in Table 1.

TABLE 1

| Sample | | Phase difference (nm) | Thickness (μm) | Resistivity (Ω·cm) | Spin density (Number/cm³) | N (ppm) | Si (ppm) |
|---|---|---|---|---|---|---|---|
| A | vapor phase synthesis | 65 | 200 | $3.80 \times 10^{11}$ | $8.00 \times 10^{16}$ | 3 | 1 |
| B | vapor phase synthesis | 40 | 200 | $1.10 \times 10^{13}$ | $6.00 \times 10^{16}$ | 4 | 0.2 |
| C | vapor phase synthesis | 20 | 300 | $5.50 \times 10^{12}$ | $3.00 \times 10^{16}$ | 1 | 0.3 |
| D | vapor phase synthesis | 45 | 300 | $9.00 \times 10^{12}$ | $7.00 \times 10^{16}$ | 5 | 20 |
| E | vapor phase synthesis | 70 | 200 | $9.00 \times 10^{11}$ | $1.50 \times 10^{17}$ | 7 | 10 |
| F | natural IIa | unmeasurable | 300 | not measured | not measured | 1 | 0 |
| G | natural IIa | unmeasurable | 300 | not measured | not measured | 1 | 0 |
| H | natural Ia | unmeasurable | 300 | not measured | not measured | 1 | 0 |
| I | natural Ia | unmeasurable | 300 | not measured | not measured | 1 | 0 |
| J | high-temp., high-pressure synthesis Ib | 10 | 300 | not measured | not measured | 100 | 0 |
| K | high-temp., high-pressure synthesis Ib | 8 | 300 | not measured | not measured | 150 | 0 |
| L | high-temp., high-pressure synthesis Ib | 12 | 300 | not measured | not measured | 120 | 0 |
| M | high-temp., high-pressure synthesis IIa | 1 | 300 | $2.50 \times 10^{13}$ | $5.00 \times 10^{15}$ | 1 | 0 |

| Sample | XRC (sec) | H (ppm) | Thermal conductivity (W/m·K) | Electron (cm²/V·s) | Hole (cm²/V·s) | Raman (cm⁻¹) |
|---|---|---|---|---|---|---|
| A | 21 | 120 | 1900 | 1350 | 1100 | 2.4 |
| B | 22 | 30 | 2100 | 1600 | 1400 | 1.8 |
| C | 28 | 20 | 2150 | 1750 | 1650 | 1.9 |
| D | 65 | 45 | 2080 | 1700 | 1700 | 1.7 |
| E | 40 | 80 | 1950 | 1450 | 1200 | 2.3 |
| F | 700 | 0 | 1980 | unmeasurable | unmeasurable | 2.3 |
| G | 900 | 0 | 1900 | unmeasurable | unmeasurable | 2.4 |
| H | 70 | 0 | 1450 | unmeasurable | unmeasurable | 2.5 |
| I | 15 | 0 | 1600 | unmeasurable | unmeasurable | 2.6 |
| J | 7 | 0 | 1700 | 200 | unmeasurable | 2.5 |
| K | 9 | 0 | 1600 | 150 | unmeasurable | 1.8 |
| L | 7 | 0 | 1650 | 300 | unmeasurable | 1.9 |
| M | 5 | 0 | 2080 | 810 | 750 | 1.7 |

| Sample | Hydrogen plasma (×10⁴/cm²) | Tomography (×10⁴/cm²) | Young's modulus (GPa) | Diameter (mm) | Transmittance (%) |
|---|---|---|---|---|---|
| A | 21.0 | 25.5 | 1020 | 6 | 51 |
| B | 3.5 | 1.9 | 1050 | 7 | 58 |
| C | 1.7 | 2.8 | 1110 | 8 | 65 |
| D | 1.5 | 1.9 | 1080 | 13.5 | 63 |
| E | 12.0 | 18.0 | 990 | 6 | 48 |
| F | 25.0 | 22.0 | 1200 | 4 | 45 |
| G | 26.0 | 35.0 | 1050 | 4 | 40 |
| H | 35.0 | 40.0 | 900 | 3 | 0 |
| I | 38.0 | 21.0 | 890 | 3 | 0 |
| J | 21.0 | 33.0 | 1200 | 4 | 0 |
| K | 19.0 | 40.0 | 1250 | 5 | 0 |
| L | 19.5 | 51.0 | 1150 | 5 | 0 |
| M | 1.9 | 1.5 | 1180 | 3 | 61 |

B-D: Examples of the present invention; A and E to M: Comparative Examples

Samples A, B, and C all had excellent half-width values for the rocking curve (on the order of 20 seconds), but Sample A had a considerable variance in phase difference from place to place. Accordingly, the resistivity decreased by about ten to the eleventh power. With a sample such as this, device characteristics will be adversely affected in applications that required high dielectric strength voltage. This is believed to be because there is variance in the amount of strain from place to place in the sample, for reasons such as that the seed substrate is single crystal diamond made by high-temperature, high-pressure synthesis, and that no etching was performed on the seed substrate prior to growth.

With Samples B and C, C had less strain because the etching of the seed substrate side surfaces reduced strain originating at the seed substrate side surfaces, and both samples provided a high-quality substrate, or a high-quality optical window or other such optical components when applied as an electronic device substrate, or an optical component material for an optical window or the like.

With Sample D, the effect of the CVD growth conditions was that the phase difference was greater and more impurities were incorporated than with the above-mentioned B and C. However, even under these conditions, if the phase difference is controlled to less than 50 nm per 100 μm of thickness, both resistivity and transmittance can be raised, and a high-quality component can be provided for use as an electronic device substrate or an optical component material.

With Samples F to L, either both hole mobility and electron mobility or just electron mobility was too low and could not be measured. With Samples F to I, the amount of strain was too large and the phase difference could not be measured.

INDUSTRIAL APPLICABILITY

As discussed above, the diamond of the present invention is a large, high-quality single crystal diamond that could not be obtained up to now, and opens up new applications in semiconductor device substrates, and in optical components that need to have low strain.

The invention claimed is:

1. A single crystal diamond grown by vapor phase synthesis, wherein when one main surface is irradiated with a linearly polarized light considered to be the synthesis of two mutually perpendicular linearly polarized light beams, the phase difference between the two mutually perpendicular linearly polarized light beams exiting another main surface on the opposite side is, at a maximum, not more than 50 nm per 100 μm of crystal thickness over the entire crystal, wherein the single crystal diamond has a thickness of at least 200 μm and not more than 1500 μm, and a half-width between 10 and 80 seconds in an X-ray rocking curve in a (400) plane over an entire crystal, and has, as impurities, a concentration of hydrogen atoms between 20 and 70 ppm and a concentration of nitrogen atoms between 0.01 and 100 ppm.

2. The single crystal diamond according to claim 1, wherein the single crystal diamond has a resistivity of at least $10^{12} \Omega \cdot cm$ at room temperature.

3. The single crystal diamond according to claim 1, wherein the spin density obtained by electron spin resonance is not more than $1 \times 10^{17}/cm^3$ at room temperature within a g value range of at least 2.002 and less than 2.0028.

4. The single crystal diamond according to claim 1, wherein the concentration of silicon atoms contained as an impurity is from 0.01 to 1000 ppm.

5. The single crystal diamond according to claim 1, wherein the single crystal diamond has a thermal conductivity of at least 2000 W/m·K at room temperature.

6. The single crystal diamond according to claim 1, wherein the single crystal diamond has a hole mobility of at least 1500 $cm^2/V \cdot sec$ at room temperature.

7. The single crystal diamond according to claim 1, wherein the single crystal diamond has an electron mobility of at least 1500 $cm^2/V \cdot sec$ at room temperature.

8. The single crystal diamond according to claim 1, wherein a peak appearing at a Raman shift of 1332 $cm^{-1}$ in Raman spectroscopy has a half-width of not more than 2 $cm^{-1}$.

9. The single crystal diamond according to claim 1, wherein surface etch pits appearing as a result of hydrogen plasma treatment are present in a quantity of not more than $1 \times 10^5$ per square centimeter.

10. The single crystal diamond according to claim 1, wherein the number of crystal defects as evaluated by light scattering tomography is not more than $1 \times 10^5$ per square centimeter.

11. The single crystal diamond according to claim 1, wherein the single crystal diamond has a Young's modulus of at least $5 \times 10^{11}$ Pa.

12. The single crystal diamond according to claim 1, wherein the single crystal diamond has a diameter of at least 4 mm.

13. The single crystal diamond according to any of claim 1, wherein the single crystal diamond has a diameter of at least 10 mm.

14. The single crystal diamond according to claim 1, wherein the concentration of nitrogen atoms as an impurity is from 0.01 to 5 ppm.

15. The single crystal diamond according to claim 1, wherein the single crystal diamond has a transmittance of at least 30% at a wavelength of 250 nm.

16. A semiconductor substrate comprising the single crystal diamond according to claim 1.

17. An optical window comprising the single crystal diamond according to claim 1.

* * * * *